United States Patent
Jelinek et al.

(10) Patent No.: US 11,195,695 B2
(45) Date of Patent: *Dec. 7, 2021

(54) ION IMPLANTATION METHOD, ION IMPLANTATION APPARATUS AND SEMICONDUCTOR DEVICE

(71) Applicant: Infineon Technologies AG, Neubiberg (DE)

(72) Inventors: Moriz Jelinek, Villach (AT); Michael Brugger, Lieserbruecke (AT); Hans-Joachim Schulze, Taufkirchen (DE); Werner Schustereder, Villach (AT); Peter Zupan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 234 days.

This patent is subject to a terminal disclaimer.

(21) Appl. No.: 16/112,178

(22) Filed: Aug. 24, 2018

(65) Prior Publication Data
US 2019/0066977 A1     Feb. 28, 2019

(30) Foreign Application Priority Data
Aug. 25, 2017   (DE) .......................... 102017119571.8

(51) Int. Cl.
*H01J 37/317* (2006.01)
*H01L 21/265* (2006.01)
(Continued)

(52) U.S. Cl.
CPC ........ *H01J 37/3171* (2013.01); *H01J 37/304* (2013.01); *H01J 37/3023* (2013.01); *H01L 21/046* (2013.01); *H01L 21/265* (2013.01); *H01L 21/2654* (2013.01); *H01L 21/26506* (2013.01); *H01L 21/26513* (2013.01); *H01L 21/26546* (2013.01); *H01J 2237/047* (2013.01);
(Continued)

(58) Field of Classification Search
CPC ................. H01L 21/046; H01L 21/365; H01L 21/26506; H01L 21/26513; H01L 21/2654; H01L 29/1608; H01J 37/3023; H01J 37/304; H01J 37/3171
See application file for complete search history.

(56) References Cited

U.S. PATENT DOCUMENTS

| 6,229,148 B1 | 5/2001 | Prall et al. |
| 2003/0224612 A1 | 12/2003 | Merrett et al. |

(Continued)

FOREIGN PATENT DOCUMENTS

DE     102015115173 A1     3/2017

OTHER PUBLICATIONS

Salehi et al., "Characterization of the Ion Beam Current Density of the RF Ion Source with Flat and Convex Extraction Systems," 2018, Silicon, 10, pp. 2743-2749 (Year: 2018).*

(Continued)

*Primary Examiner* — Bo B Jang
(74) *Attorney, Agent, or Firm* — Murphy, Bilak & Homiller, PLLC

(57) ABSTRACT

An ion implantation method includes changing an ion acceleration energy and/or an ion beam current density of an ion beam while effecting a relative movement between a semiconductor substrate and the ion beam impinging on a surface of the semiconductor substrate.

13 Claims, 7 Drawing Sheets

(51) Int. Cl.
  *H01J 37/302* (2006.01)
  *H01J 37/304* (2006.01)
  *H01L 21/04* (2006.01)
  *H01L 29/08* (2006.01)
  *H01L 29/16* (2006.01)

(52) U.S. Cl.
  CPC ... *H01J 2237/30461* (2013.01); *H01L 29/083* (2013.01); *H01L 29/0878* (2013.01); *H01L 29/1608* (2013.01)

(56) References Cited

U.S. PATENT DOCUMENTS

| | | | |
|---|---|---|---|
| 2009/0124066 A1 | 5/2009 | England et al. | |
| 2012/0248324 A1* | 10/2012 | Eisner | H01J 37/302 250/396 ML |
| 2015/0200073 A1* | 7/2015 | Jen | H01J 37/302 250/282 |
| 2015/0214347 A1 | 7/2015 | Falck et al. | |
| 2015/0371858 A1 | 12/2015 | Laven et al. | |
| 2019/0066977 A1 | 2/2019 | Jelinek et al. | |

OTHER PUBLICATIONS

Ryssel, Heiner, et al., "Ion Implantation", B.G. Teubner Stuttgart; 1st Edition, 1978, pp. 124-129; with English Translation attached.
Laska, T., et al., "Ultrathin-Wafer Technology for a New 600V-NPT-IGBT", Proc. of 9th International Symposium on Power Semiconductor Development and IC's (ISPSD), 1997, pp. 361-364.

* cited by examiner $$V^E_{target} = dE/dt_{target} / I_{B,expected}$$
$$V^E_{feedback} = dE/dt_{set} / I_{B,meas}$$

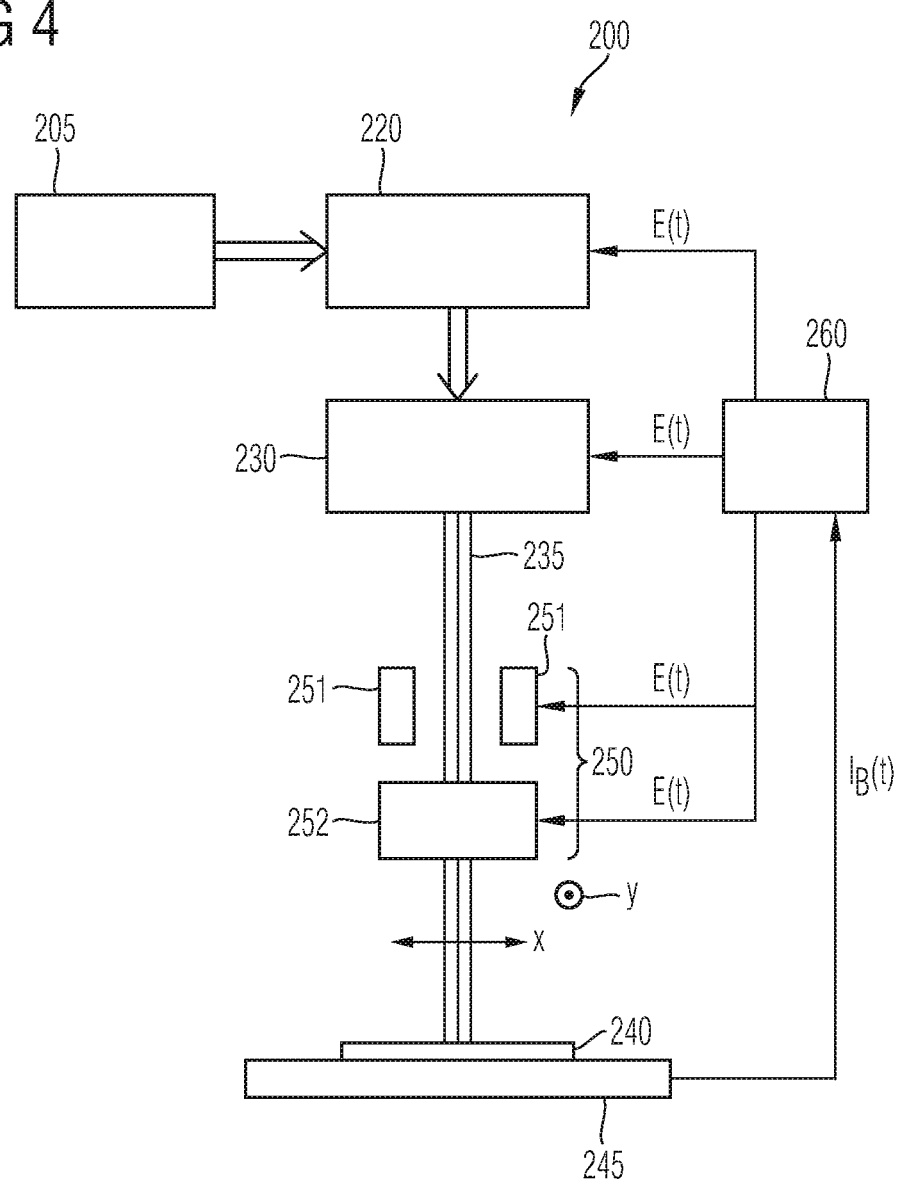

ION IMPLANTATION METHOD, ION IMPLANTATION APPARATUS AND SEMICONDUCTOR DEVICE

BACKGROUND

Some parameters of semiconductor devices can be linked to properties of vertical dopant profiles. For example, vertical power semiconductor devices that control a load current flow between a first load electrode at a front side and a second load electrode at a rear side of a semiconductor die include doped regions such as drift zone, compensation structures, buffer layers and field stop layers with specific vertical dopant profiles, wherein parameters of the vertical dopant profiles of these layers such as uniformity, smoothness and undulation may have substantial impact on device parameters. Compared to in-situ doping during layer deposition, ion implantation allows for precisely monitoring both total dose and dose rate. Ion implantation typically leads to a Gaussian-like distribution of the dopants around an end-of-range-peak which distance to a substrate surface is a function of an ion acceleration energy of the implanted ions. Formation of doping profiles having a small degree of undulation, for example box-like or triangular doping profiles may be limited by constraints of process technology, for example by a limited thermal budget for rear side processes in view of finished front side structures.

There is a need for an improved ion implantation method and an improved ion implantation apparatus.

SUMMARY

The present disclosure relates to an ion implantation method. The ion implantation method comprises changing an ion acceleration energy of an ion beam while effecting a relative movement between a semiconductor substrate and the ion beam impinging on a surface of the semiconductor substrate.

The present disclosure further relates to an ion implantation apparatus. The ion implantation apparatus comprises a scanning assembly configured to effect a relative movement between an ion beam and a semiconductor substrate along a first scan direction and along a second scan direction. The ion implantation apparatus further comprises a control unit configured to change an ion acceleration energy of the ion beam during the relative movement between the semiconductor substrate and the ion beam impinging on a surface of the semiconductor substrate.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 4 is a schematic illustration of an ion implantation apparatus based on electrostatic scanning along first and second scan directions.

DETAILED DESCRIPTION

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

Figure 1:
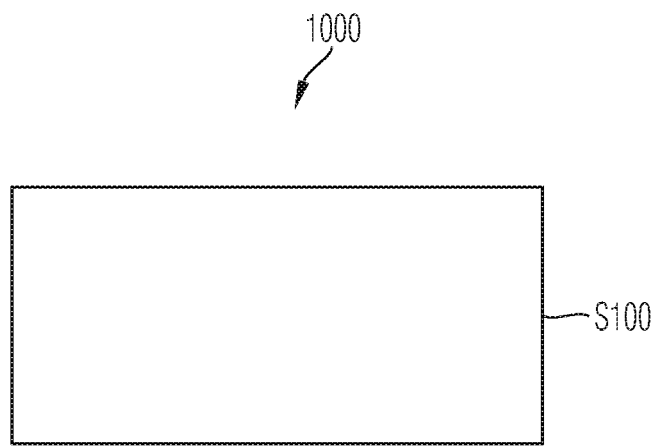
FIG. 1 is a simplified flow-chart for illustrating an ion implantation method.

FIG. 1 is a schematic flow-chart for illustrating an ion implantation method 1000.

It will be appreciated that while ion implantation method 1000 is illustrated and described below as a series of steps or events, the illustrated ordering of such steps or events are not to be interpreted in a limiting sense. For example, some steps may occur in different orders and/or concurrently with other steps or events apart from those illustrated and/or described herein. In addition, not all steps may be required to implement one or more aspects of embodiments of the disclosure herein. Also, one or more of the steps depicted herein may be divided in one or more separate sub-steps and/or phases.

Referring to FIG. 1, process feature S100 comprises changing an ion acceleration energy (also referred to as ion implantation energy) of an ion beam while effecting a relative movement between a semiconductor substrate and the ion beam impinging on a surface of the semiconductor substrate. Hence, the ion acceleration energy, for example determined by an ion acceleration voltage of an ion acceleration unit, is altered during a single ion implantation process. A single ion implantation process is an ion implantation process that is based on a single implant recipe and is not interrupted by a tuning period for changing the implant recipe, for example. In other words, during a single ion implantation process, an ion beam is continuously directed on a target, for example a wafer, i.e. the ion beam is not temporally interrupted for tuning purposes. The ion beam may include ions, for example, protons, helium or ions with an atomic number greater 4, for example ions of nitrogen, aluminum, boron, phosphorus, arsenic, sulfur, selenium, germanium, antimony, or oxygen. In one or more embodiments, changing the ion acceleration energy may be subject to a closed-loop control process.

In one or more embodiments, changing the ion acceleration energy comprises controlling a temporal change of the acceleration energy $dE/dt$ depending on a value of a measured ion beam current density $I_{B,meas}$. The ion beam current density $I_{B,meas}$ may be measured by an ion current detector unit, for example by a Faraday cup. By taking the measured ion beam current density $I_{B,meas}$ into account, the temporal change of the ion acceleration energy $dE/dt$ normalized to the ion beam current density may be the control variable, thereby allowing for counteracting variations in ion beam current density. This is beneficial with respect to achieving a desired local implant dose, i.e. an implant dose at a certain implant depth regardless of variations in the ion beam current density.

In one or more embodiments, changing the ion acceleration energy comprises controlling a change of the acceleration energy E depending on an value of a measured integrated ion beam current density $I_{B,meas}$, i.e. $\int_0^t I_{B,meas}\, dt$ being a measured ion beam current density $I_{B,meas}$ integrated over time.

In one or more embodiments, the method further comprises converting a target doping concentration versus depth $D_L(x_p)$, $x_p(E)$ being a projected range of dopants depending on implantation or ion acceleration energy, into a target temporal change of the ion acceleration energy normalized to the ion beam current density $dE/dt(E)$ $(I_{B,norm})_{set} = dE/dt(E)/I_{B,expected}$, $I_{B,expected}$ being an expected ion beam current density. The target doping concentration versus depth $D_L(x_p)$ may be a desired doping profile to be realized by ion implantation. Ion implantation processes at a fixed ion implantation or acceleration energy may have to be carried out a plurality of times for realizing the target doping concentration versus depth $D_L(x_p)$. This may require additional effort and costs in view of tuning cycles between subsequent ion implantation processes for altering implant recipes. By controlling the temporal change of the ion acceleration energy $dE/dt$ depending on a value of the measured ion beam current density $I_{B,meas}$, the target doping concentration versus depth $D_L(x_p)$ may be realized by a single ion implantation process based on a single implant recipe. The expected ion beam current density $I_{B,expected}$ may be calculated taking into account parameters set in the implant recipe, for example a local dose to be introduced at an initial ion acceleration energy.

In one or more embodiments, the temporal change of the ion acceleration energy $dE/dt$ may be controlled within an ion acceleration energy window $\Delta E = E_2 - E_1$, wherein values of an initial ion acceleration energy $E_1$ and a final ion acceleration energy $E_2$ may be determined depending on the target doping concentration versus depth $D_L(x_p)$. By way of example, the greater the depth range of dopants to be introduced is, the greater the ion acceleration energy window $\Delta E$ is. Likewise, the greater the target doping concentration at a certain depth is, the smaller the temporal change of the ion acceleration energy $dE/dt$ is.

In one or more embodiments, controlling the temporal change of the ion acceleration energy $dE/dt$ depending on the measured ion beam current density $I_{B,meas}$ further comprises comparing, at an ion acceleration energy E, a target temporal change of the ion acceleration energy normalized to the ion beam current density $dE/dt$ $(I_{B,norm})_{set} = dE/dt_{target}/I_{B,expected}$, $I_{B,expected}$ being an expected beam current, with a set temporal change of ion acceleration energy normalized to the measured ion beam current density $I_{B,meas}$, $dE/dt_{set}/I_{B,meas}$. When the temporal change of the ion acceleration energy $dE/dt$ normalized to the ion beam current density is the control variable, a closed loop control unit has a feedback loop which ensures the control unit exerts a control action to give an actual process output, i.e. the set temporal change of ion acceleration energy normalized to the measured ion beam current density $dE/dt_{set}/I_{B,meas}$ the same as the so-called reference input or set point, i.e. $dE/dt_{target}/I_{B,expected}$, $I_{B,expected}$. For this reason, the closed loop control unit acts as a feedback control unit. By way of example, assuming that the ion beam current density drops due to fluctuations during an ion implantation process, the control unit will counteract this drop by decreasing the set value of $dE/dt$, thereby bringing the actual temporal change of ion acceleration energy normalized to the measured ion beam current density, i.e. $dE/dt_{set}/I_{B,meas}$ closer to the target temporal change of the ion acceleration energy normalized to the ion beam current density $dE/dt$ $(I_{B,norm})_{set} = dE/dt_{target}/I_{B,expected}$, $I_{B,expected}$.

The control process therefore allows for counteracting variations in ion beam current density while realizing a target doping concentration profile in the semiconductor body based on a single ion implantation recipe. This is not only beneficial with respect to achieving a desired local implant dose, i.e. an implant dose at a certain implant depth regardless of variations in ion beam current density, but also beneficial with regard to ion implantation process simplicity by reducing effort and cost of tuning cycles that are necessary when realizing the target doping profile by a plurality of separate ion implantation processes at different ion acceleration or implantation energies, i.e. each one of the plurality of separate ion implantation processes beings based on a separate implant recipe.

In one or more embodiments, the relative movement between the semiconductor substrate and the ion beam impinging on the surface of the semiconductor substrate is effected by deflecting the ion beam along a first scan direction and along a second scan direction. The relative movement along the first scan direction, for example an x-direction may be effected by electrostatic field scanning. Likewise, the relative movement along the second scan direction, for example a y-direction may also be effected by electrostatic field scanning.

In one or more embodiments, the relative movement between the semiconductor substrate and the ion beam impinging on the surface of the semiconductor substrate is effected by deflecting the ion beam along a first scan direction and by mechanically moving the semiconductor substrate along a second scan direction. The relative movement along the first scan direction, for example an x-direction may be effected by electrostatic field scanning. The relative movement along the second scan direction, for example a y-direction may comprise placing the semiconductor substrate on a substrate carrier of a rotating unit and rotating the substrate carrier. A plurality of semiconductor substrates, for example more than 3, or more than 5, or more than 7, or more than 9, or more than 11, and less than 17, or less than 15, or less than 13 wafers may be placed on the substrate carrier, for example a spinning disc or a spinning wheel.

In one or more embodiments, a scanning speed of the relative movement between the semiconductor substrate and the ion beam along each of the first scan direction and the second scan direction ranges between 10 m/s to 30 km/s, or between 10 m/s to 10 m/s, or between 10 m/s to 1 m/s, or between 10 m/s to 100 m/s. Hence, regardless of whether the relative movement between the semiconductor structure and the ion beam is effected by ion beam deflection along both scan directions or by a combination of ion beam deflection and fast mechanical scanning, a fast scan speed is achieved compared with rather slow scan speeds of mechanical scan systems that are in the range of cm/s.

In one or more embodiments, the method further comprises, while effecting a relative movement between the semiconductor substrate and the ion beam impinging on the surface of the semiconductor substrate, setting input parameters of units for focusing or deflecting the ion beam based on a function $f(E)=\Sigma_{i=0}^{n}\alpha_i E^i$, n being an integer larger than two. The function $f(E)$ may also include half-integral exponents, for example $f(E)=\Sigma_{i=0}^{n}\alpha_i E^i+\Sigma_{i=0}^{m}b_i E^{i+1/2}$, n and m being integers larger than two. For each ion implantation or acceleration energy $E(t)$ that is set while sweeping the ion acceleration energy window $\Delta E=E_2-E_1$, an input parameter $p_m$, m being an identifier of the input parameter, for example a voltage or a current of a focusing or a deflecting unit of an ion implantation apparatus is set by the function $f_m(E)=\Sigma_{i=0}^{n}\alpha_i E^i$. Thus, the input parameters $p_m$ of the focusing or deflecting units are continuously updated during the ion implantation process that is based on a single implant recipe.

Figure 2:
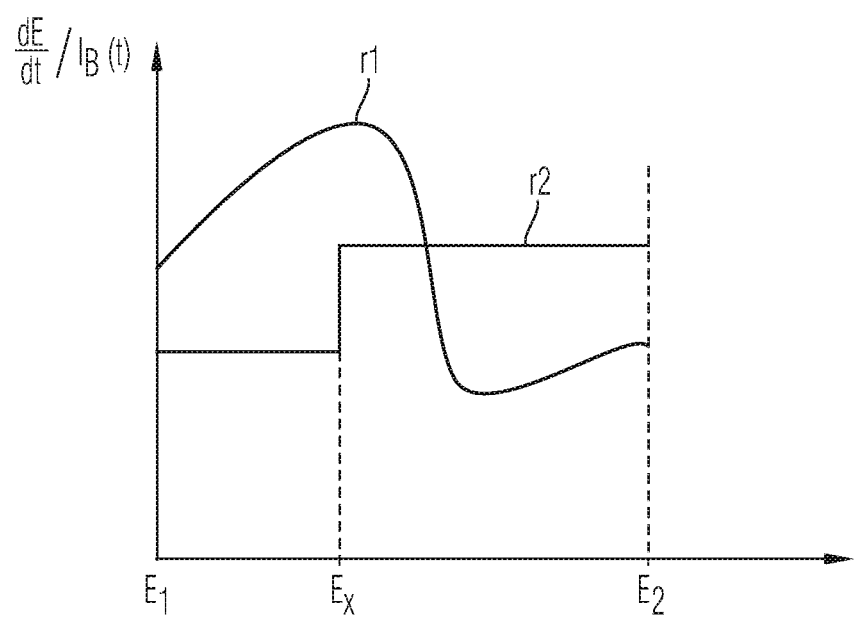
FIG. 2 is a schematic graph for illustrating curves r1, r2 of a temporal change of the ion acceleration or implantation energy normalized to the ion beam current density dE/dt/Ib (t) versus the ion acceleration or implantation energy with respect to an energy window $\Delta E = E_2 - E_1$.

Referring to the schematic graph of FIG. 2, schematic curves r1, r2 of a temporal change of the ion acceleration energy normalized to the ion beam current density $dE/dt/I_B(t)$ versus ion acceleration energy are illustrated with respect to the ion acceleration energy window $\Delta E=E_2-E_1$, wherein values of an initial ion acceleration energy $E_1$ and a final ion acceleration energy $E_2$ may be determined depending on the target doping concentration versus depth $D_L(x_p)$ that is to be formed. The temporal change of the ion acceleration energy normalized to the measured ion beam current density $dE/dt/I_B(t)$ may correspond to the reference input of the control unit, i.e. $dE/dt_{target}/I_{B,expected}$. Curve r1 is associated with a target doping profile having a steep decrease in doping concentration at a depth corresponding to a projected range at an ion implantation or acceleration energy Ex, whereas curve r2 is associated with a target doping profile having a doping concentration minimum located between a doping concentration maximum and a surface from where dopants enter the semiconductor substrate by the ion implantation process.

Figure 3A:
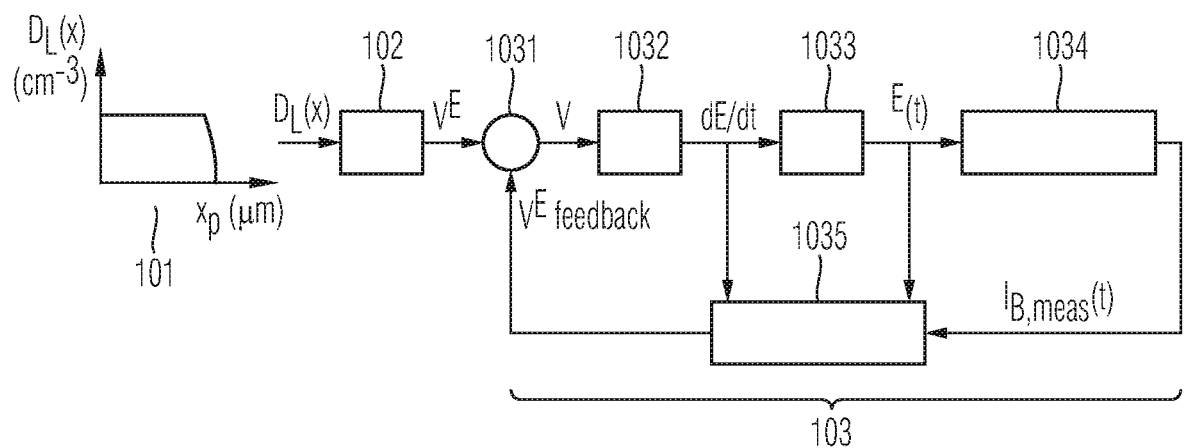
FIGS. 3A and 3B are schematic block diagrams for illustrating a closed-loop control process of the temporal change of the ion implantation or acceleration energy normalized to the measured ion beam current density $dE/dt/I_B$ (t).
Figure 3B:
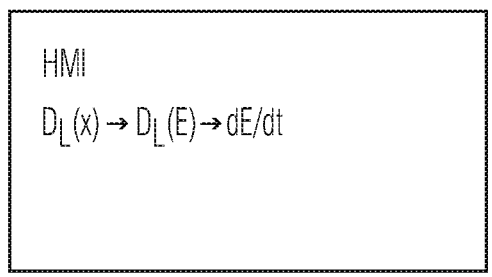

Referring to the schematic diagrams of FIGS. 3A and 3B, a closed-loop control process of the temporal change of the ion acceleration energy normalized to the measured ion beam current density $dE/dt/I_B(t)$ is illustrated. At process phase 101, a target doping concentration profile $D_L(x)$ is specified, for example by semiconductor process simulation based on TCAD (Technology Computer Aided Design) simulation tools. The target doping concentration profile $D_L(x)$ may then be input to a human machine interface (HMI) or conversion unit 102 that is illustrated in more detail in FIG. 3B. The HMI unit 102 converts the target doping concentration versus depth $D_L(x)$ into a target doping concentration versus energy $D_L(E)$, and the target doping concentration versus energy $D_L(E)$ into a temporal ion acceleration or implantation energy dE/dt by taking a functional dependence E(x) between the implantation energy E and corresponding projected range x into account. This conversion by the HMI unit 102 may be based on dopant-specific experimental and/or simulation data of profile parameters such as, for example projected range, longitudinal straggle, skewness or kurtosis. The HMI unit 102 outputs a target temporal change of the ion acceleration energy normalized to the ion beam current density $V^E_{target}=dE/dt_{target}/I_{B,expected}$ that is input into a closed-loop control unit 103 as a reference input. An automatic controller unit 1031 that may include an error detector and an amplifier compares the actual value of the temporal change of the ion acceleration energy normalized to the measured ion beam current density, i.e. $V^E_{feedback}=dE/dt_{set}/I_{B,meas}$ with the reference input, i.e. the target value $V^E_{target}=dE/dt_{target}/I_{B,expected}$, determines the deviation, and generates a control signal c that will reduce the deviation between $V^E_{feedback}$ and $V^E_{target}$. If $V^E_{feedback}$ is greater than $V^E_{target}$ the control signal may cause a decrease of dE/dt for increasing a local dose at a certain implant depth. Likewise, if $V^E_{feedback}$ is smaller than $V^E_{target}$ the control signal c may cause an increase of dE/dt for decreasing a local dose at a certain implant depth. The control signal c of the automatic controller unit 1031 is output to an actuator unit 1032 that determines the temporal change of the ion acceleration or implantation energy dE/dt according to the control signal c so that $V^E_{feedback}$ will approach $V^E_{target}$. The temporal change of the ion acceleration energy dE/dt is the output from the actuator unit 1032 to an integration unit 1033 that determines the actual ion acceleration energy E(t). The actual ion acceleration energy E(t) is the output from the integration unit 1033 to units of an ion implantation apparatus part 1034 that are operated based on the ion acceleration energy E(t), for example acceleration unit(s), focusing unit(s) or deflection unit(s). A feedback control unit 1035 receives, as an input signal, a measured value of the ion beam current density $I_{B,meas}(t)$. The ion beam current density $I_{B,meas}(t)$ may be measured by an ion current detector unit, for example by a Faraday cup being part of the ion implantation apparatus part 1034. The feedback control unit 1035 further receives the actual temporal change of ion acceleration energy $dE_{set}/dt$ and determines $V^E_{feedback}$. The value $V^E_{feedback}$ is then output to the automatic controller unit 1031, thereby closing the feedback loop.

Figure 3C:
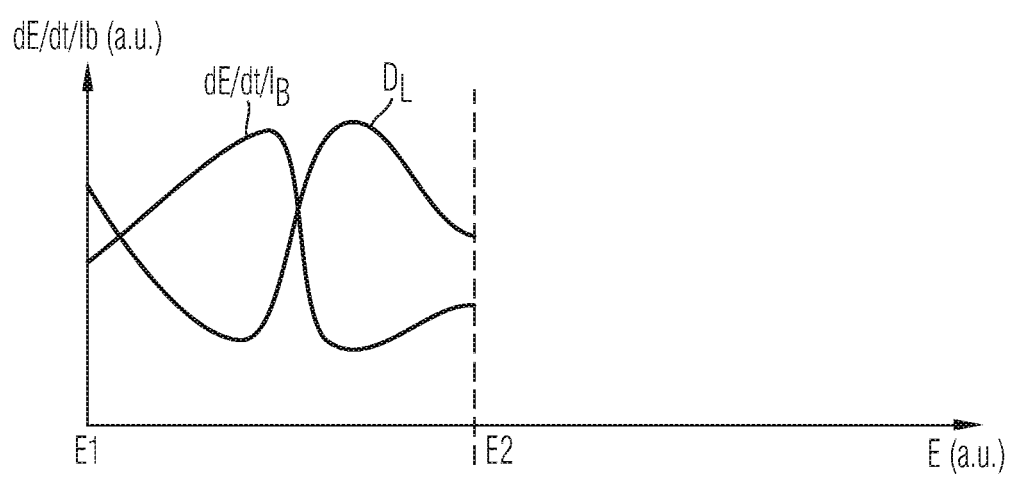
FIG. 3C is a schematic graph for illustrating a relation between a temporal change of the ion acceleration energy normalized to the ion beam current density $dE/dt/I_B(t)$ versus ion acceleration energy and the doping concentration versus ion acceleration energy.

FIG. 3C is a graph for illustrating a relation between a temporal change of the ion acceleration energy normalized to the ion beam current density $dE/dt/I_B(t)$ versus ion acceleration energy and the doping concentration versus ion acceleration energy $D_L(E)$. The illustration is simplified as it is, inter alia, based on a linear relationship between the projected range x and ion acceleration energy E.

FIG. 4 shows an ion implantation apparatus 200 including an ion source 205 generating and emitting ions, for example, protons, helium or ions with an atomic number greater 4, for example ions of nitrogen, aluminum, boron, phosphorus, arsenic, sulfur, selenium, germanium, or oxygen. An acceleration unit 220 may accelerate a selected type of ions and may filter out others. A collimator unit 230 may align the directions of motion of the ions in a direction parallel to a beam axis and may direct a collimated ion beam 235 onto a semiconductor substrate 240, which may be temporarily fixed, e.g. by vacuum on a substrate carrier 245. In a plane orthogonal to the beam axis an ion distribution in the collimated ion beam 235 may be point-symmetric to a beam center.

A cross-sectional area of the ion beam 235 may be in the order from few hundred square micrometers to few square centimeters. A scanning assembly 250 scans the ion beam 235 along a beam track over a main surface of the semiconductor substrate 240 to distribute the ions uniformly across the semiconductor substrate 240. The beam track may include straight sections, zig-zag patterns, may form circles, may form a spiral or any other typical scan pattern.

The scanning assembly 250 controls the scan by electrostatic fields, wherein the scanning assembly 250 controls a relative movement between the ion beam 235 and the semiconductor substrate 240 along a first scan direction x and along a second scan direction y. The first and second scan directions x, y may be perpendicular to one another, for example. In the embodiment illustrated in FIG. 4, the scanning assembly 250 includes a first deflection sub-unit 251 for deflecting the ion beam 235 along the first scan direction x. The ion beam 235 traverses a region between a pair of first deflection electrodes deflecting the ion beam 235 along the first scan direction x. Then the ion beam passes a pair of second deflection electrodes of a second deflection sub-unit 252 deflecting the ion beam 235 along a linear second scan direction y that may be orthogonal to the drawing plane. The electric fields in the first and second deflection sub-units 251, 252 sweep the ion beam 235 across the complete main surface of the semiconductor substrate 240.

The ion implantation apparatus 200 further includes a control unit 260 configured to change an ion acceleration energy E of the ion beam 235 during the relative movement between the semiconductor substrate 240 and the ion beam 235 impinging on a surface of the semiconductor substrate 240. The control unit 260 may control the change of the ion acceleration energy normalized to the ion beam current density $dE/dt/I_B$ as described with reference to the embodiments illustrated in FIGS. 1 to 3B above, for example. The control unit 260 may output the ion acceleration or implantation energy E(t) to units of the ion implantation apparatus 200, for example to the acceleration unit 220, to the collimator unit 230 and to the first and second deflection sub-units 251, 252. The ion beam current density $I_B(t)$ may be measured by one or more ion current detector units, for example by Faraday cups close to the semiconductor substrate 240 at the substrate carrier 245. The measured ion beam current density $I_{B,meas}(t)$ is output to the control unit 260.

Figure 5:
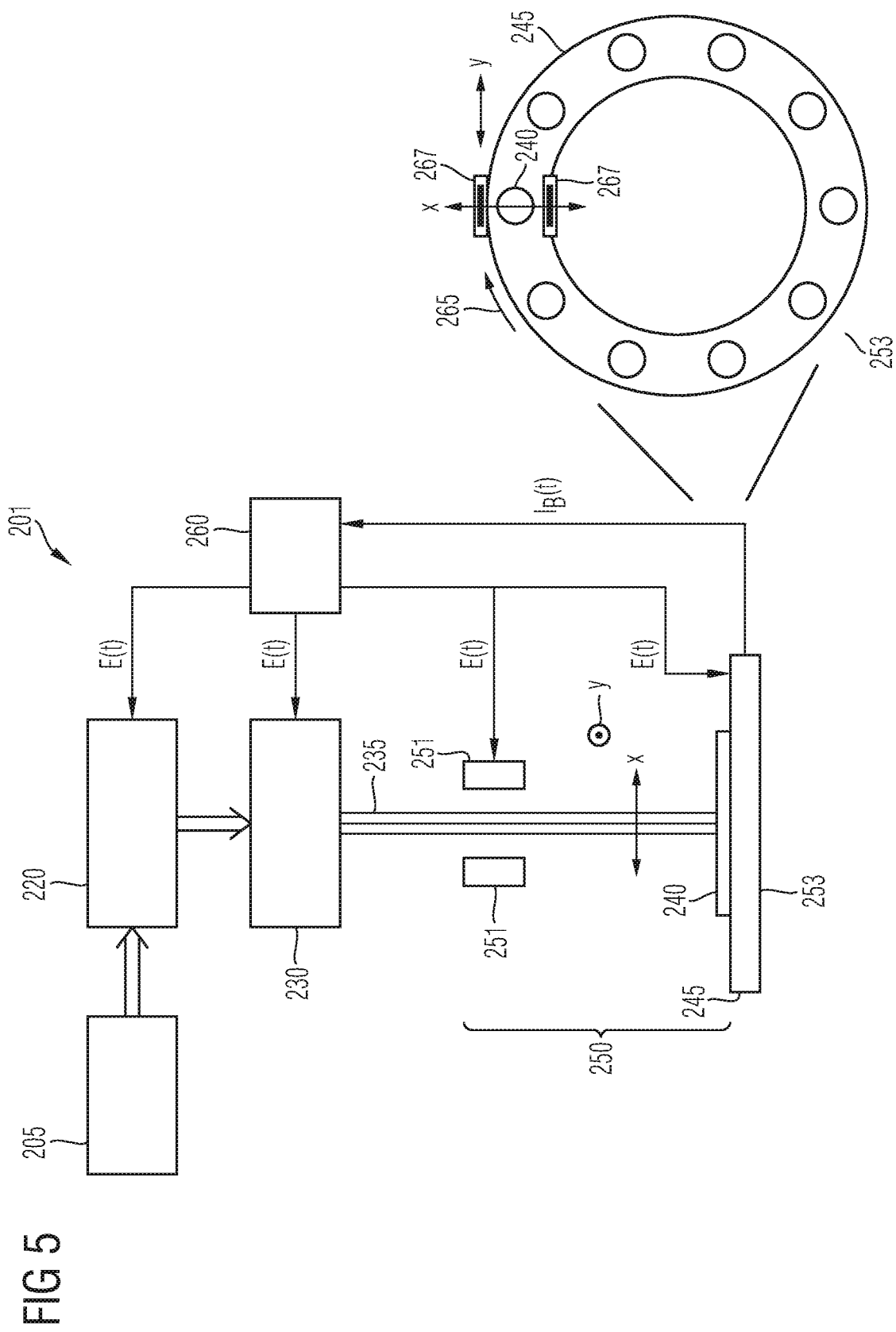
FIG. 5 is a schematic illustration of an ion implantation apparatus based on both electrostatic and mechanical scanning.

FIG. 5 shows an ion implantation apparatus 201 including the ion source 205, the acceleration unit 220, the collimator unit 230 and the control unit 260 as described with reference to the ion implantation apparatus 200 illustrated in FIG. 4. Other than the ion implantation apparatus 200 of FIG. 4, the ion implantation apparatus 201 is based on both electrostatic scanning and mechanical scanning. Electrostatic scanning along the first scan direction x is effected by the first deflection sub-unit 251 of the scanning assembly 250. Scanning along the second scan direction y is effected by moving the semiconductor substrate 240 relative to the ion beam 235 along the second scan direction y caused by a rotation of the substrate carrier 245. The substrate carrier 245 may be part of a rotating unit 253. In one or more embodiments, the substrate carrier 245 is disc-like or wheel-like and configured to hold a number of semiconductor substrates, for example by vacuum. Rotating the substrate carrier 245 along a radial direction 265 effects the relative movement between semiconductor substrate 240 and the ion beam 235 along the second scan direction y. A rotation speed of the rotating unit 253 may be in the range of hundreds or thousands of rpm, thereby achieving a fast scan with scan speeds of more than 10 m/s, or even more than 100 m/s. Ion current detector units 267 may be arranged on the substrate carrier 245 for measuring the ion beam current density $I_{B,meas}(t)$ that is output to the control unit 260. The Ion current detector units 267 may intersect an ion beam path along the first direction x.

Figure 6:
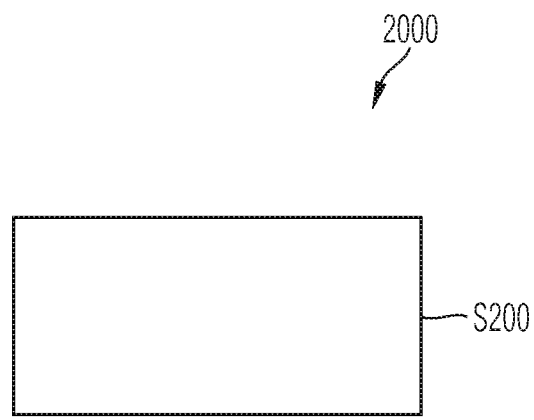
FIG. 6 is a simplified flow-chart for illustrating another ion implantation method.

FIG. 6 is a schematic flow-chart for illustrating an ion implantation method 2000.

It will be appreciated that while ion implantation method 2000 is illustrated and described below as a series of steps or events, the illustrated ordering of such steps or events are not to be interpreted in a limiting sense. For example, some steps may occur in different orders and/or concurrently with other steps or events apart from those illustrated and/or described herein. In addition, not all steps may be required to implement one or more aspects of embodiments of the disclosure herein. Also, one or more of the steps depicted herein may be divided in one or more separate sub-steps and/or phases.

Referring to FIG. 6, process feature S200 comprises changing an ion beam current density of an ion beam while effecting a relative movement between a semiconductor substrate and the ion beam impinging on a surface of the semiconductor substrate. The ion beam may include ions, for example, protons, helium or ions with an atomic number greater 4, for example ions of nitrogen, aluminum, boron, phosphorus, arsenic, sulfur, selenium, germanium, antimony, or oxygen.

In one or more embodiments, changing the ion beam current density may be subject to a closed-loop control process while changing the ion acceleration energy may be subject to an open-loop control process.

Figure 7:
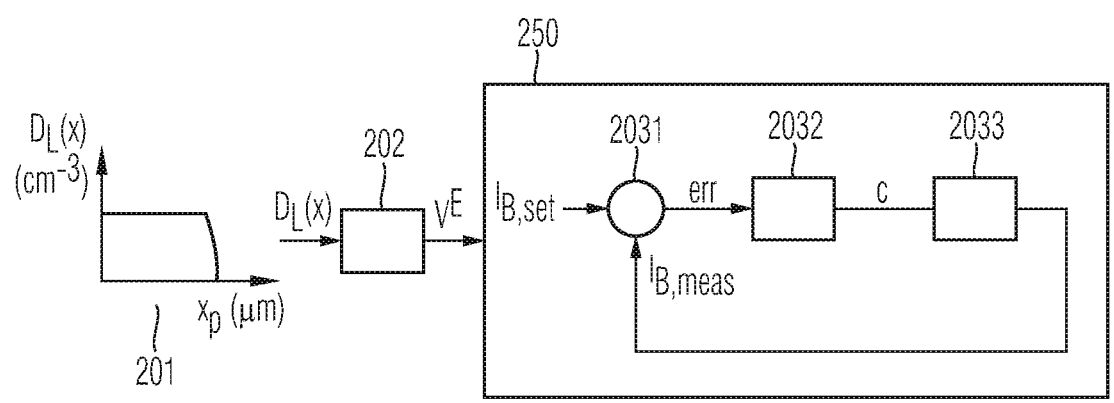
FIG. 7 is a schematic block diagram for illustrating a closed-loop control process of the ion beam current density.

Referring to the schematic diagrams of FIG. 7, an open-loop control process of the temporal change of the ion acceleration energy normalized to a set ion beam current density $dE/dt/I_{B,set}$ in combination with a closed-loop control process of the ion beam current density is illustrated. At process phase 201, a target doping concentration profile $D_L(x)$ is specified, for example by semiconductor process simulation based on TCAD (Technology Computer Aided Design) simulation tools. The target doping concentration profile $D_L(x)$ may then be input to a human machine interface (HMI) or conversion unit 202. The HMI unit 202 converts the target doping concentration versus depth $D_L(x)$ into a target doping concentration versus energy $D_L(E)$, and the target doping concentration versus energy $D_L(E)$ into a temporal change of the ion acceleration or implantation energy dE/dt by taking a functional dependence E(x) between the implantation energy E and corresponding projected range x into account. This conversion by the HMI unit 202 may be based on dopant-specific experimental and/or simulation data of profile parameters such as, for example projected range, longitudinal straggle, skewness or kurtosis. The HMI unit 202 outputs a target temporal change of the ion acceleration energy normalized to a set ion beam current density $V^E = dE/dt/I_{B,set}$ that is input into a beamline system 250. In the beamline system 250, the set ion beam current density undergoes a closed-loop control process. A comparator unit 2031 that may include an error detector and an amplifier compares the actual value of the ion beam current density $I_{B,meas}$ with the reference input, i.e. $I_{B,set}$, determines the deviation, and generates an error signal err as the input signal to an automatic controller 2032, e.g. PID Controller, that generates a control signal c according to the error signal err so that $I_{B,meas}$ will approach $I_{B,set}$. A beam current regulator unit 2033 receives the control signal c as an input signal for adjusting the beam current. The ion beam current density $I_{B,meas}$ may be measured by an ion current detector unit, for example by a Faraday cup being part of the ion implantation apparatus and input to the comparator unit 2031, thereby achieving the closed-loop control of the ion beam current density while controlling the temporal change of the ion acceleration or implantation energy dE/dt by an open-loop process.

The ion implantation method and the ion implantation apparatus described above may be used to manufacture semiconductor devices, for example field effect transistors (FETs), insulated gate bipolar transistors (IGBTs) or diodes in any kind of semiconductor substrate material, for example silicon (Si), silicon carbide (SiC), silicon germanium (Site), germanium (Ge), gallium arsenide (GaAs), gallium nitride (GaN).

The ion implantation method described above may be used for manufacturing of field stop zones in silicon substrates by proton implantation. Instead of multiple ion implantations at different implant energies based on different implant recipes, a single ion implantation process may be sufficient. Likewise drift zone doping in SiC may be realized by a single ion implantation process. In low-voltage Si semiconductor devices drift zone doping and body doping may be realized by a single ion implantation process, in medium and high voltage Si or SiC semiconductor devices, a single ion implantation process may be carried out between successive layer depositions, for example. In Si and SiC semiconductor devices, super junction structures may be realized having a constant or almost constant doping concentration versus depth. Also deep doping regions at a rear side of a semiconductor substrate may be realized based on a low thermal budget that may be required for rear side processing in view of thermal budget constraints due to finished front side structures, for example.

Figure 8:
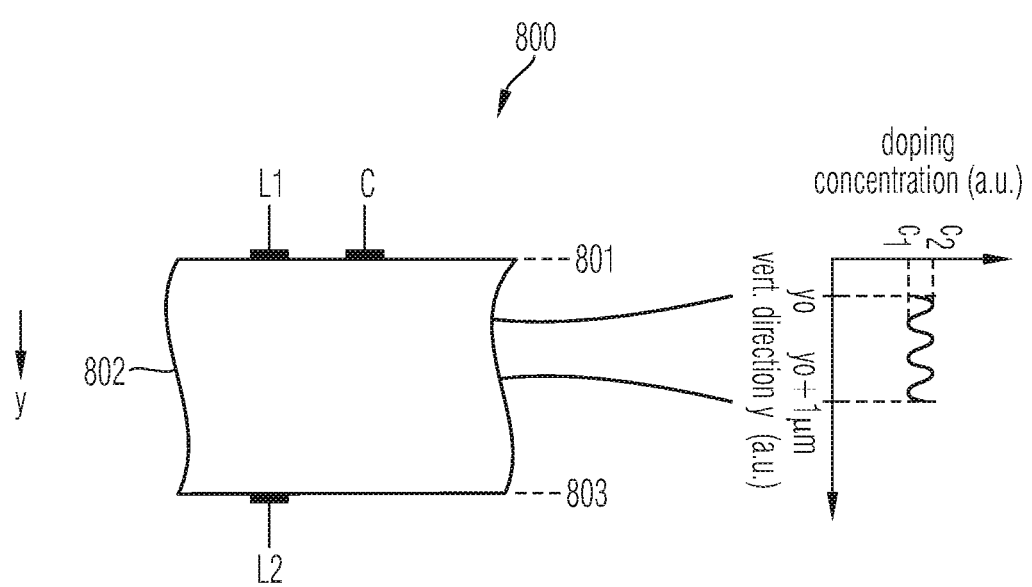
FIG. 8 is a schematic cross-sectional view of a SiC semiconductor device.

FIG. 8 is a schematic cross-sectional view of a SiC semiconductor device 800. The SiC semiconductor device 800 includes a first load terminal L1, for example a source electrode, and a control terminal C, for example a gate electrode at a first surface 801 of a SiC semiconductor body 802. The SiC semiconductor device 800 further includes a second load terminal L2, for example a drain electrode at a second surface 803 of the SiC semiconductor body 802. At least one of a drift zone and a buffer zone in the SiC semiconductor body 802 includes at least one doping concentration maximum per 5 µm, 3 µm or 1 µm vertical extension. In the schematic illustration of FIG. 8, three doping concentration maxima are illustrated for illustration purposes. A different number of doping concentration maxima may be used, for example 1, 2, 4, 5 or even more doping concentration maxima per 5 µm, 3 µm or 1 µm vertical extension.

In one or more embodiments, a value c1 of a doping concentration minimum next to a doping concentration maximum is more than 10% smaller than a value c2 of the doping concentration maximum, i.e. $c1<0,9 \times c2$, or $c1<0,8 \times c2$, or $c1<0,5 \times c2$.

In one or more embodiments, the ion implantation method described in the embodiments above may be carried out before and after an epitaxial layer growth process. The implants carried out before the epitaxial layer growth process may be set deeper in the SiC semiconductor body of the final semiconductor device than the implants carried out after the epitaxial layer growth. This allows for realizing deeper doping profiles than what may be achieved by a maximum ion implantation energy.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An ion implantation method, comprising:
effecting a relative movement between a semiconductor substrate and an ion beam impinging on a surface of the semiconductor substrate; and
changing an ion acceleration energy of the ion beam while effecting the relative movement between the semiconductor substrate and the ion beam impinging on the surface of the semiconductor substrate,
wherein changing the ion acceleration energy comprises controlling a temporal change of the acceleration energy dE/dt depending on a value of a measured ion beam current density $I_{B,meas}$,
wherein controlling the temporal change of the acceleration energy dE/dt depending on a value of the measured ion beam current density $I_{B,meas}$ further comprises comparing, at an ion acceleration energy E, a target temporal change of the ion acceleration energy normalized to the ion beam current density dE/dt $(I_{B,norm})_{set}$=dE/$dt_{target}/I_{B,expected}$, $I_{B,expected}$ being an expected beam current, with a set temporal change of the ion acceleration energy normalized to $I_{B,meas}$, dE/$dt_{set}/I_{B,meas}$.

2. The ion implantation method of claim 1, further comprising:
converting a target doping concentration versus depth $D_L(x_p)$, $x_p(E)$ being a projected range of dopants depending on the ion acceleration energy, into a target temporal change of the ion acceleration energy normalized to the ion beam current density dE/dt(E) $(I_{B,norm})_{set}$=dE/dt(E)/$I_{B,expected}$, $I_{B,expected}$ being an expected beam current density.

3. The ion implantation method of claim 1, wherein the relative movement between the semiconductor substrate and the ion beam impinging on the surface of the semiconductor substrate is effected by deflecting the ion beam along a first scan direction and along a second scan direction.

4. The ion implantation method of claim 3, wherein a scanning speed of the relative movement between the semiconductor substrate and the ion beam along each of the first scan direction and the second scan direction ranges between 10 m/s to 30 km/s.

5. The ion implantation method of claim 1, wherein the relative movement between the semiconductor substrate and the ion beam impinging on the surface of the semiconductor substrate is effected by deflecting the ion beam along a first scan direction and by mechanically moving the semiconductor substrate along a second scan direction.

6. The ion implantation method of claim 5, wherein mechanically moving the semiconductor substrate along the second scan direction comprises placing the semiconductor substrate on a substrate carrier of a rotating unit and rotating the substrate carrier.

7. The ion implantation method of claim 5, further comprising:
while effecting the relative movement between the semiconductor substrate and the ion beam impinging on the surface of the semiconductor substrate, setting input parameters of units for focusing or deflecting the ion beam based on a function $f(E)=\Sigma_{i=0}^{n}a_{i}E^{i}$, n being an integer larger than two.

8. An ion implantation method, comprising:
effecting a relative movement between a semiconductor substrate and an ion beam impinging on a surface of the semiconductor substrate;
changing an ion acceleration energy of the ion beam while effecting the relative movement between the semiconductor substrate and the ion beam impinging on the surface of the semiconductor substrate, wherein changing the ion acceleration energy comprises controlling a change of the acceleration energy E depending on a value of a measured integrated ion beam current density $I_{B,meas}$; and
converting a target doping concentration versus depth $D_L(x_p)$, $x_p(E)$ being a projected range of dopants depending on the ion acceleration energy, into a target temporal change of the ion acceleration energy normalized to the ion beam current density $dE/dt(E)$ $(I_{B,norm})_{set}=dE/dt(E)/I_{B,expected}$, $I_{B,expected}$ being an expected beam current density.

9. An ion implantation method, comprising:
effecting a relative movement between a semiconductor substrate and an ion beam impinging on a surface of the semiconductor substrate; and
changing an ion acceleration energy of the ion beam while effecting the relative movement between the semiconductor substrate and the ion beam impinging on the surface of the semiconductor substrate,
wherein the relative movement between the semiconductor substrate and the ion beam impinging on the surface of the semiconductor substrate is effected by deflecting the ion beam along a first scan direction and along a second scan direction.

10. The ion implantation method of claim 9, wherein a scanning speed of the relative movement between the semiconductor substrate and the ion beam along each of the first scan direction and the second scan direction ranges between 10 m/s to 30 km/s.

11. An ion implantation method, comprising:
effecting a relative movement between a semiconductor substrate and an ion beam impinging on a surface of the semiconductor substrate; and
changing an ion acceleration energy of the ion beam while effecting the relative movement between the semiconductor substrate and the ion beam impinging on the surface of the semiconductor substrate,
wherein the relative movement between the semiconductor substrate and the ion beam impinging on the surface of the semiconductor substrate is effected by deflecting the ion beam along a first scan direction and by mechanically moving the semiconductor substrate along a second scan direction.

12. The ion implantation method of claim 11, wherein mechanically moving the semiconductor substrate along the second scan direction comprises placing the semiconductor substrate on a substrate carrier of a rotating unit and rotating the substrate carrier.

13. The ion implantation method of claim 11, further comprising:
while effecting the relative movement between the semiconductor substrate and the ion beam impinging on the surface of the semiconductor substrate, setting input parameters of units for focusing or deflecting the ion beam based on a function $f(E)=\Sigma_{i=0}^{n}a_{i}E^{i}$, n being an integer larger than two.

* * * * *